US007605465B2

(12) United States Patent
Takagi

(10) Patent No.: US 7,605,465 B2
(45) Date of Patent: Oct. 20, 2009

(54) SEMICONDUCTOR DEVICE FOR HIGH FREQUENCY POWER AMPLIFICATION

(75) Inventor: Kazutaka Takagi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 46 days.

(21) Appl. No.: 11/317,182

(22) Filed: Dec. 27, 2005

(65) Prior Publication Data

US 2006/0138655 A1   Jun. 29, 2006

(30) Foreign Application Priority Data

Dec. 28, 2004  (JP) .............................. 2004-381896

(51) Int. Cl.
  *H01L 23/373* (2006.01)
(52) U.S. Cl. ................... 257/707; 257/677; 257/713; 257/E23.056
(58) Field of Classification Search ............... 257/712, 257/713, 720, 677, 691, 705
See application file for complete search history.

(56) References Cited

U.S. PATENT DOCUMENTS

| 5,492,661 | A | * | 2/1996 | Weddigen et al. | ............ 264/109 |
| 2002/0105071 | A1 | * | 8/2002 | Mahajan et al. | ............. 257/720 |
| 2003/0015348 | A1 | * | 1/2003 | Lee et al. | ..................... 174/260 |
| 2004/0251540 | A1 | * | 12/2004 | Eguchi et al. | ................ 257/713 |

FOREIGN PATENT DOCUMENTS

JP   2002-190540   7/2002

OTHER PUBLICATIONS

U.S. Appl. No 12/296,624, filed Oct. 9, 2008, Takagi.

* cited by examiner

*Primary Examiner*—Allan R. Wilson
(74) *Attorney, Agent, or Firm*—Oblon, Spivak, McClelland, Maier & Neustadt, L.L.P.

(57) ABSTRACT

A semiconductor device includes, a metal base plate, a semiconductor element mounted on the base plate, first and second dielectric plates are mounted on the base plate in the vicinity of the semiconductor element. The first and second dielectric plates are composed of such an insulator material as diamond having higher heat conductivity than that of the base plate material.

16 Claims, 2 Drawing Sheets

SEMICONDUCTOR DEVICE FOR HIGH FREQUENCY POWER AMPLIFICATION

CROSS-REFERENCE TO RELATED APPLICATIONS

This application is based upon and claims the benefit of priority from the prior Japanese Patent Application No. 2004-381896, filed on Dec. 28, 2004; the entire contents of which are incorporated herein by reference.

BACKGROUND TECHNOLOGY OF THE INVENTION

The present invention relates to a semiconductor device used in a high frequency band, for example.

Recent years, the semiconductor devices used in the high frequency band having such transistors as a gallium arsenide field effect transistor or the like (hereinafter referred to GaAs-FET), for example, as its circuit elements is required to take some measures against heat generated by the transistors during operation with progress in high integration of the elements.

Here, a conventional semiconductor device using GaAs FET is explained referring to FIG. 1.

A semiconductor element 21, a GaAs FET, for example, used for power amplification is mounted on a metal base plate 20. A first dielectric plate 22 is provided on an input side (on the left hand side in the figure) of the semiconductor element 21. On the first dielectric plate 22, a circuit pattern 22a composing, for example, an input side matching circuit etc. is formed. A second dielectric plate 23 is provided on the output side (on the right hand side in the figure) of the semiconductor element 21. On the second dielectric plate 23, a circuit pattern 23a composing an output side matching circuit, for example, is provided. A side wall 24 having a rectangular frame shaped in a plan view is formed with a predetermined height on the base plate 20 surrounding the semiconductor element 21, the first dielectric plate 22 and the second dielectric plate 23. The major portion of the side wall 24 is composed of metal, for example, and the rectangular opening at its upper end is sealed with a metal lid 25. A package is composed of the metal base plate 20, side wall 24 and the metal lid 25.

An input side power supply portion 24a including an insulator is provided in one of the sides of the side wall 24 (on the left hand side in the figure), through which an input line conductor 26a penetrates. An input lead pin 27a is connected with the input line conductor 26a outside the package.

An output side power supply portion 24b including an insulator is provided on another side of the side wall 24 (on the right hand side in the figure), through which an output line conductor 26b penetrates. An output lead pin 27b is connected with the output line conductor 26b outside the package.

The circuit pattern 22a on the first dielectric plate 22 is connected with the input line conductor 26a and with the semiconductor element 21 by wires W1 and by wires W2 respectively. The circuit pattern 23a on the second dielectric plate 23 is connected with the semiconductor element 21 and with the output line conductor 26b by wires W3 and by wires W4 respectively.

In the semiconductor device described above, input signals introduced by the input line 26a are amplified by the semiconductor element 21 and is outputted from the output line 26b.

In the semiconductor device, heat is generated from the semiconductor element 21 during its operation. The heat generated by the semiconductor element 21 is transmitted to the base plate 20 provided right under the semiconductor element 21. The heat generated from the semiconductor element 21 is transmitted from the region right under the semiconductor element 21 toward the base plate 20 spreading with an angle of about 45° and is radiated from an undersurface of the base plate 20.

A semiconductor device described is disclosed in Japanese published patent application H9-153839, in which semiconductor elements and other circuit elements are enclosed in a package consisting of a side wall provided on a base plate 20 having an opening at its upper end and a lid for covering the opening formed by the side wall.

In the conventional semiconductor device, heat generated in the semiconductor element 21 is radiated outside through the base plate 20 for mounting the semiconductor element 21. Here, heat dissipation property of the base plate 20 is determined by a product of an area of such a heat source as the semiconductor element 21 and heat resistance of the base plate 20. In the conventional semiconductor device, however, efficient dissipation of the heat could not be expected, because the semiconductor element 21 is small and thus the area of the heat source is small.

Further, the base plate 20 is required to have electrical conductivity as well as the heat dissipation property, because the base plate 20 functions as a ground electrode. Therefore, single layer copper or a multilayer copper structure, in which molybdenum or tungsten layer is interposed between copper layers for mechanical reinforcement of the plate, is used as the base plate 20.

Copper has high electricity conductivity and has high heat conductivity among various metal materials. However, the heat conductivity is around 400 W/m·K and sufficient heat dissipation efficiency cannot be obtained, when the semiconductor device is of high integration and heat generation from the semiconductor element 21 is high. Further, heat dissipation of the base plate 20 having the multilayer structure is degraded compared to that of the single layer copper, because the heat conductivity of the molybdenum or tungsten is lower than that of copper.

SUMMARY OF THE INVENTION

According to one aspect of the present invention, a semiconductor device is provided including a metal base plate, a semiconductor element mounted on the base plate, and a dielectric plate, which is formed with an insulator material having higher heat conductivity than that of the base plate material and is provided on the base plate adjacent to the semiconductor element, and a circuit pattern formed on the surface of the dielectric plate.

According to another aspect of the present invention, a semiconductor device is provided including a base plate, a semiconductor element mounted on the base plate, a first dielectric plate mounted on the base plate at one side of the semiconductor element and having a first circuit pattern formed on the surface, a second dielectric plate mounted on the base plate at another side of the semiconductor element and having a second circuit pattern formed on the surface, a frame-shaped side wall provided on the base plate surrounding the first dielectric plate, second dielectric plate and the semiconductor element, a power supply portion provided on a part of the side wall and composed of an insulator, a band-shaped conductor penetrating the power supply portion, and interconnections which connect the first band-shaped conductor with the first circuit pattern, the first circuit pattern with the semiconductor element, the semiconductor element with the second circuit pattern and the second circuit pattern with the second band-shaped conductor, wherein the first dielectric plate or the second dielectric plate is mounted on the base plate adjacent to the semiconductor element, and is formed with an insulator having higher heat conductivity than the base plate.

DETAILED DESCRIPTION OF THE INVENTION

Figure 1:
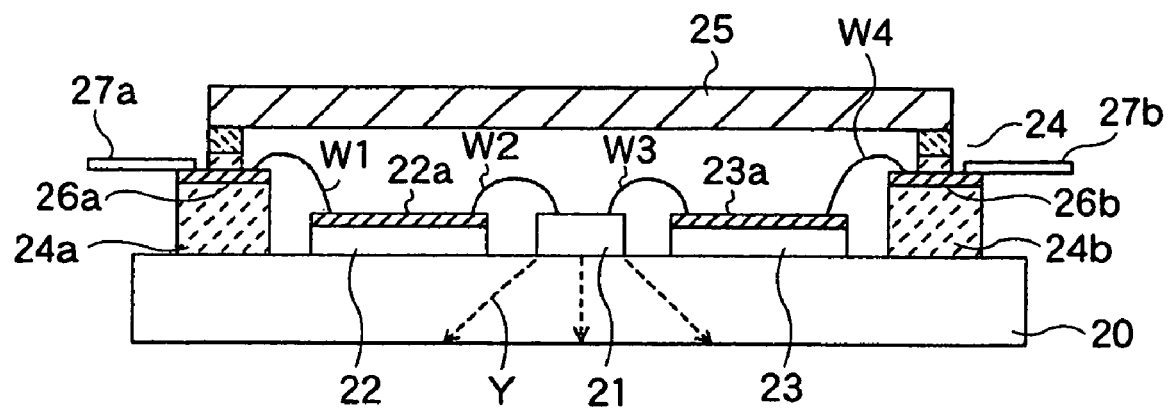
FIG. 1 is a cross sectional view showing an example of a conventional semiconductor device.
Figure 2:
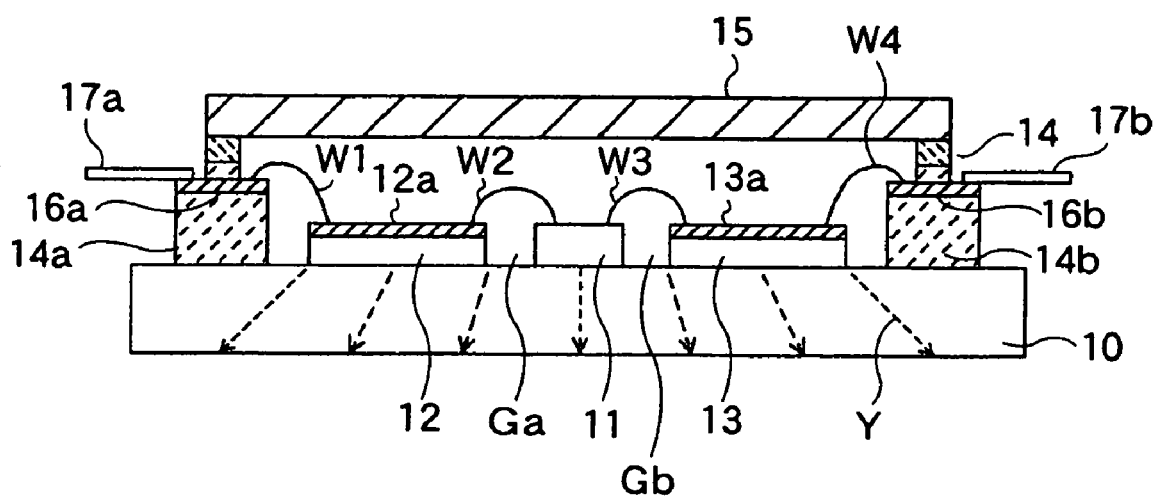
FIG. 2 is a cross sectional view showing a semiconductor device according to an embodiment of the present invention.

An embodiment of the present invention will be explained referring to FIG. 2, which is an example of a semiconductor device using a GaAsFET.

A semiconductor element 11 is mounted on a metal base plate 10 composed of copper. The semiconductor element 11 is, for example, a GaAs FET for power amplification generating heat during its operation. A first dielectric plate 12 composed of an insulator material having higher heat conductivity than that of the base plate 10 is provided on the input side (on the left hand side in the figure) of and adjacent to the semiconductor element 11 with a narrow gap Ga between the semiconductor element 11. The first dielectric plate 12 is made of a diamond, for example. On the first dielectric plate 12, a circuit pattern 12a composing an input side matching circuit, for example, is formed.

A second dielectric plate 13 composed of an insulator material having higher heat conductivity than that of the base plate 10 is provided on the output side (on the right hand side in the figure) of and adjacent to the semiconductor element 11 with a narrow gap Gb between the semiconductor element 11. The first dielectric plate 12 is also made of a diamond, for example. On the second dielectric plate 13, a circuit pattern 13a composing an output side matching circuit, for example, is formed.

A frame-shaped side wall 14 having a square or rectangular configuration is provided with a predetermined height surrounding the semiconductor element 11, the first dielectric plate 12, and the second dielectric plate 13. The major portion of the side wall 14 is composed of metal. An opening, formed at an upper end of the side wall 14, is sealed with a metal lid 15. A package is composed of a metal base plate 10, the side wall 14 and the metal lid 15.

In an input side of the side wall 14 (on the left hand side in the figure), an input side power supply portion 14a is provided, which includes such an insulator as ceramic. An input line 16a penetrates through the power supply portion 14a. The input line 16a is connected with an input lead pin outside the package.

In an output side of the side wall 14 (on the right hand side in the figure), an output side power supply portion 14b is provided, which includes similarly such an insulator as ceramic. An output line 16b penetrates through the power supply portion 14b. The output line 16b is connected with output lead pin 17b outside the package.

The circuit pattern 12a on the first dielectric plate 12 is connected with the input line conductor 16a and with the semiconductor element 11 by wires W1 and wires W2 respectively. The circuit pattern 13a on the second dielectric plate 13 is connected with the semiconductor element 11 and with the output line conductor 16b by wires W3 and by wires W4 respectively.

In the semiconductor device described above, input signals introduced by the input line 16a are amplified by the semiconductor element 11 and is outputted through the output line 16b.

In the semiconductor device described above, the first dielectric plate 12 and the second dielectric plate 13 formed with a material having higher heat conductivity than the base plate 10 such as the diamond, for example, are mounted on the base plate 10 in the vicinity of the semiconductor element 11, which generates heat during operation. A diamond has a high heat conductivity of 2 kW/m·K. Therefore, the heat generated by the semiconductor element 11 is transmitted to the first dielectric plate 12 and the second dielectric plate 13 through the base plate 10 or through the gap Ga and Gb, which are narrower than the thickness of the base plate 10. The heat is then transmitted downward through the base plate 10 from heat source areas right under the semiconductor element 11, the first dielectric plate 12 and the second dielectric plate 13, spreading with an angle of about 45° as shown by dotted arrow Y.

In the semiconductor device described above, the heat generated by the semiconductor element 11 diffuses horizontally to the first dielectric plate 12 and the second dielectric plate 13 and is transmitted to the base plate 20 spreading in a wide range. Therefore, the substantial area of the heat source is enlarged and thus excellent heat dissipation is realized.

The heat is transmitted to the base plate 10 spreading from the heat source with the angle of nearly 45°. Therefore, it is preferable that the gap Ga or Gb between the semiconductor element 11 and the first dielectric plate 12 or between the semiconductor element 11 and the second dielectric plate 13 is equal to or less than the thickness of the base plate 10, so that a part of the heat generated by the semiconductor element 11 diffuses horizontally to the first dielectric plate 12 or to the second dielectric plate 13.

Figure 3:
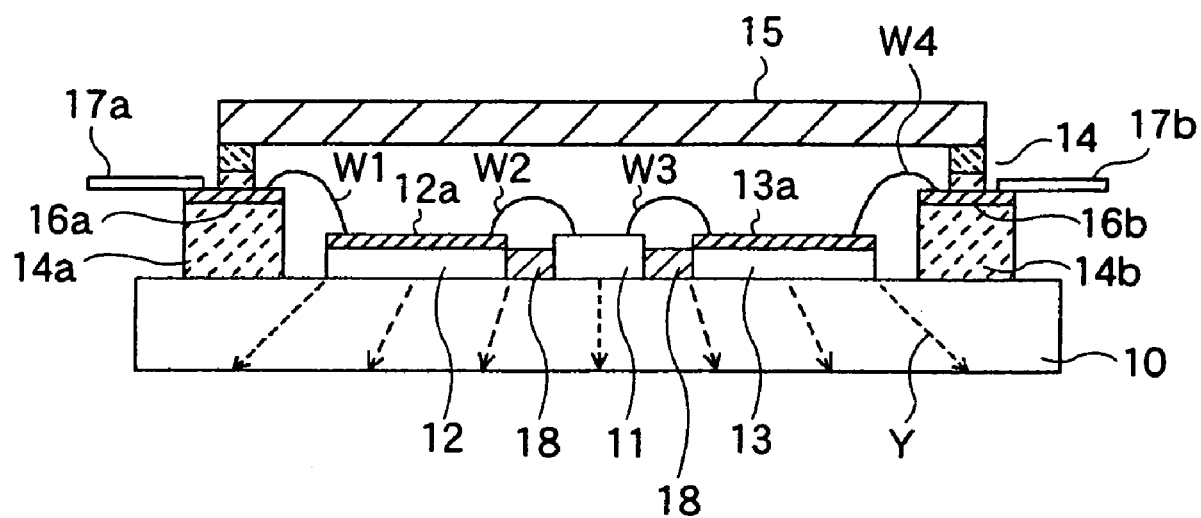
FIG. 3 is a cross sectional view showing a semiconductor device according to another embodiment of the present invention.

FIG. 3 is a cross sectional view of a semiconductor element which shows another embodiment of the present invention. In the embodiment, the gap Ga or Gb between the semiconductor element 11 and the first dielectric plate 12 or between the semiconductor element 11 and the second dielectric plate 13 is filled with such a material as an insulative resin filler 18 having higher heat conductivity than that of air. Here, a thickness of the resin filler 18 may be at least a half of the thickness of the first or the second dielectric plate and a half of the thickness of the semiconductor element 11. With such configuration, the heat conducting efficiency between the semiconductor element 11 and the first dielectric plate 12 or between the semiconductor element 11 and the second dielectric plate 13 is improved and much better heat dissipation is achieved. Because the heat conductivity of a resin is higher than that of air in general despite of the kinds of the resin, any kinds of resin can be used as a filler 18.

Although the GaAs FET is used for the semiconductor element in the above embodiment, the semiconductor element is not limited to GaAsFET, but other type of semiconductor elements generating heat during operation are applicable in the semiconductor device according to the present invention.

Further, although the base plate is composed of copper in the above embodiment, a base plate with a multilayer construction, in which molybdenum or tungsten is interposed between the copper plates for reinforcement of the mechanical strength, is applicable in the semiconductor device according to the present invention.

The invention claimed is:

1. A semiconductor device for high frequency power amplification comprising:
   a metal base plate having a function as a ground electrode;
   a semiconductor element for high frequency power amplification mounted on the base plate;
   a dielectric plate, which is formed with only an electrical insulator material having higher heat conductivity than that of the base plate material and is provided on the base plate adjacent to the semiconductor element; and
   a circuit pattern formed on a surface of the dielectric plate,
   wherein the heat conductivity of the dielectric plate having a higher heat conductivity than the base plate, is sufficiently higher than the heat conductivity of the base plate such that the heat from the semiconductor is spread through the base plate at an angle of about 45°.

2. A semiconductor device according to claim 1, wherein the dielectric plate is composed of diamond.

3. A semiconductor device according to claim 1, wherein an insulating resin is filled in a gap between the semiconductor element and the dielectric plate.

4. A semiconductor device according to claim 3, wherein the insulating resin is filled in the gap up to at least half a depth of the gap.

5. A semiconductor device according to claim 3, wherein the gap between the semiconductor element and the dielectric plate is smaller than thickness of the base plate.

6. A semiconductor device comprising:
   a base plate having a function as a ground electrode;
   a semiconductor element for high frequency power amplification mounted on the base plate;
   a first dielectric plate mounted on the base plate at one side of the semiconductor element, the first dielectric plate being configured to have a first circuit pattern on a surface of the first dielectric plate;
   a second dielectric plate mounted on the base plate at another side of the semiconductor element, the second dielectric plate being configured to have a second circuit pattern on a surface of the second dielectric plate;
   a frame-shaped side wall, provided on the base plate, configured to surround the first dielectric plate, the second dielectric plate and the semiconductor element;
   a power supply portion, provided in a part of the side wall, including an insulator;
   first and second band-shaped conductors configured to penetrate the power supply portion; and
   an interconnection configured to connect the first band-shaped conductor with the first circuit pattern, the first circuit pattern with the semiconductor element, the semiconductor element with the second circuit pattern and the second circuit pattern with the second band-shaped conductor,
   wherein at least one of the first dielectric plate and the second dielectric plate is provided adjacent to the semiconductor element, and is formed with only an electrical insulator having higher heat conductivity than the base plate,
   wherein the heat conductivity of the dielectric plate having a higher heat conductivity than the base plate, is sufficiently higher than the heat conductivity of the base plate such that the heat from the semiconductor is spread through the base plate at an angle of about 45°.

7. A semiconductor device according to claim 6, wherein
   the side wall is composed of a frame having a pair of opposing sides facing to each other;
   the power supply portion includes an input side power supply portion provided in one of the pair of the opposing sides and an output side power supply portion provided in another one of the pair of the opposing sides; and
   the first dielectric plate is provided at an input side of the semiconductor element, while the second dielectric plate is provided at an output side of the semiconductor element.

8. A semiconductor device according to claim 6, wherein the semiconductor element is a gallium arsenide field effect transistor and the interconnection includes a wire.

9. A semiconductor device according to claim 6, wherein the base plate is made of copper.

10. A semiconductor device according to claim 6, wherein the power supply portion is formed by filling a notch portion formed on the side wall with a ceramic member hermetically and at least one of the first and the second band-shaped conductors penetrate through the ceramic member hermetically.

11. A semiconductor device according to claim 6, wherein a package for containing the semiconductor element, the first and the second dielectric plates are composed of at least the metal base plate, the frame-shaped side wall, and a metal lid configured to cover an upper opening formed by the frame-shaped side wall.

12. A semiconductor device according to claim 6, wherein space inside the package is formed hermetically.

13. A semiconductor device according to claim 6, wherein the dielectric plate is composed of diamond.

14. A semiconductor device according to claim 6, wherein an insulator resin is filled in a gap between the semiconductor element and the dielectric plate.

15. A semiconductor device according to claim 14, wherein the insulator resin is filled up to a depth of at least half a depth of the gap.

16. A semiconductor device according to claim 14, wherein the gap between the semiconductor element and the dielectric plate is smaller than the thickness of the base plate.

* * * * *